US006847109B2

(12) United States Patent
Shim

(10) Patent No.: US 6,847,109 B2
(45) Date of Patent: Jan. 25, 2005

(54) AREA ARRAY SEMICONDUCTOR PACKAGE AND 3-DIMENSIONAL STACK THEREOF

(75) Inventor: Jong Bo Shim, Cheonan (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/406,447

(22) Filed: Apr. 4, 2003

(65) Prior Publication Data

US 2004/0058472 A1 Mar. 25, 2004

(30) Foreign Application Priority Data

Sep. 25, 2002 (KR) .................................. 10-2002-0058056

(51) Int. Cl.[7] .......................... H01L 23/48; H01L 21/44
(52) U.S. Cl. ........................ 257/697; 257/685; 257/723; 438/107; 438/112
(58) Field of Search ........................ 438/106–110, 112, 438/124, 126, 127; 257/685, 686, 697, 723, 777, 778, 787

(56) References Cited

U.S. PATENT DOCUMENTS

| 5,973,393 | A | * | 10/1999 | Chia et al. .................. 257/690 |
| 6,093,969 | A | | 7/2000 | Lin |
| 6,137,163 | A | * | 10/2000 | Kim et al. .................. 257/686 |
| 6,235,554 | B1 | * | 5/2001 | Akram et al. ............... 438/109 |
| 6,291,259 | B1 | | 9/2001 | Chun |
| 6,451,624 | B1 | * | 9/2002 | Farnworth et al. .......... 438/106 |
| 6,479,321 | B2 | * | 11/2002 | Wang et al. ................ 438/109 |
| 6,528,348 | B2 | * | 3/2003 | Ando et al. ................. 438/109 |
| 6,566,232 | B1 | * | 5/2003 | Hara et al. .................. 438/109 |

FOREIGN PATENT DOCUMENTS

| JP | 6-268101 | 9/1994 |
| KR | 10-0216820 | 6/1999 |
| KR | 10-2001-0027266 | 4/2001 |
| KR | 20-0233845 | 5/2001 |

* cited by examiner

Primary Examiner—Kevin M. Picardat
(74) Attorney, Agent, or Firm—Harness, Dickey & Pierce, P.L.C.

(57) ABSTRACT

An area array type semiconductor package suitable for use in the formation of a 3-dimensional stack of the area array type packages. The area array type semiconductor package includes a circuit board, typically a tape circuit board, a semiconductor chip, bonding wires, an encapsulation body, solder posts, and solder balls. A plurality of the area array type semiconductor packages can be electrically connected through the corresponding solder balls and solder posts on adjacent packages to form semiconductor stack packages.

31 Claims, 5 Drawing Sheets

AREA ARRAY SEMICONDUCTOR PACKAGE AND 3-DIMENSIONAL STACK THEREOF

BACKGROUND OF THE INVENTION

This U.S. nonprovisional patent application claims priority under 35 U.S.C. § 119 of Korean Patent Application 2002-58056 filed on Sep. 25, 2002, the entire contents of which are hereby incorporated by reference.

1. Field of the Invention

The present invention generally relates to semiconductor package assembly technology and, more particularly, to an area array type semiconductor package and 3-dimensional stack of area array type packages.

2. Description of the Prior Art

The electronic industry continues to seek products that are lighter, faster, smaller, multi-functional, more reliable and more cost-effective. In an effort to meet such requirements, package assembly techniques have been developed for multi-chip packages (MCP) and chip stack packages. These types of packages combine two or more semiconductor chips in a single package, thereby realizing increased memory density, multi-functionality and/or reduced package footprint.

The use of several chips in a single package does, however, tend to reduce both reliability and yield. If, during post assembly testing, just one chip in the multi-chip or chip stack package fails to meet the functional or performance specifications, the entire package fails, causing the good chip(s) to be discarded along with the failing chip. As a result, multi-chip and chip stack package tend to lower the productivity from the assembly process.

A 3-dimensional package stack addresses this yield problem by stacking several assembled packages that each contain a single chip and that have already passed the necessary tests, thereby improving the yield and reliability of the final composite package. However, package stacks have tended to use lead frame type packages rather than area array type packages. Lead frame type packages typically utilize edge-located terminals such as outer leads, whereas area array type packages typically utilize surface-distributed terminals such as solder balls. Area array type package may therefore provide larger terminal counts and/or smaller footprints when compared with corresponding lead frame type packages.

SUMMARY OF THE INVENTION

Exemplary embodiments of the invention include an area array type semiconductor package that may be incorporated into a package stack.

Exemplary embodiments of the invention include 3-dimensional package stacks of area array type semiconductor packages having improved package interconnections.

Exemplary embodiments of the invention include semiconductor packages having solder posts connected to surface-distributed solder balls in a one-to-one correspondence. Each solder post may provide for direct interconnection between a solder ball of an upper package and a lower package during the formation of a package stack.

An exemplary embodiment of the invention is a semiconductor package having a tape circuit board, a semiconductor chip, bonding wires, an encapsulation body, solder posts, and solder balls. The tape circuit board includes a flexible base tape, a chip mounting pad, and a circuit pattern. The chip mounting pad and the circuit pattern may be formed on an upper surface of the flexible base tape. Additionally, the circuit pattern surrounds the chip mounting pad and has interconnection pads and ball mounting pads. The interconnection pads are located near the chip mounting pad, and the ball mounting pads are connected to the interconnection pads. In particular, via holes are formed to expose the ball mounting pads on a lower surface of the flexible base tape.

The semiconductor chip may be attached to the chip mounting pad and bonding wires may be used to form an electrical connection between the interconnection pads and the semiconductor chip. The encapsulation body is formed on the tape circuit board to encapsulate the semiconductor chip and the bonding wires. The encapsulation body may be formed with connecting holes that open to corresponding ball mounting pads or the connecting holes may be formed in a process separate from the formation of the encapsulation body. The connecting holes may be filled with solder to form solder posts that are electrically connected to the ball mounting pad. Solder balls may be formed on the opposite side of the ball mounting pads that are exposed through the corresponding via holes.

The solder balls and the solder posts may be aligned to form a generally vertical arrangement having a one-to-one correspondence between the solder posts and solder balls. The diameter of the connecting holes may also be sized to approximate the diameter of the corresponding via holes. In addition, the solder posts may be formed by reflowing solder balls provided on the connecting holes or by filling the connecting holes with solder paste using a process such as screen printing and then reflowing the solder paste.

A package stack according to an exemplary embodiment of the invention may be provided by stacking at least two of semiconductor packages described above. In such a package stack, the solder posts of a lower package may be directly conjoined and electrically connected to the solder balls of an upper package.

BRIEF DESCRIPTION OF THE DRAWINGS

Exemplary embodiments of the invention may be further understood through the written description and the accompanying FIGURES in which.

DETAILED DESCRIPTION OF EXEMPLARY EMBODIMENTS

Figure 1:
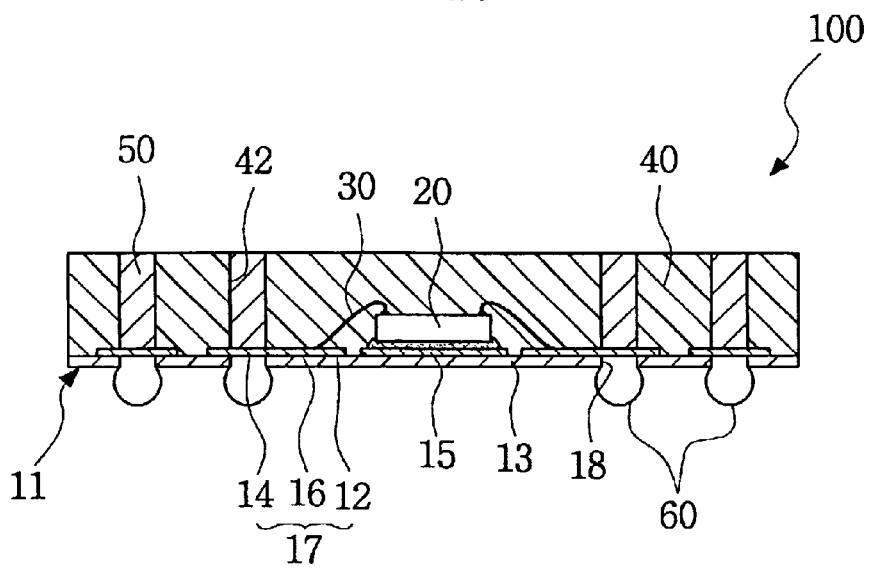
FIG. 1 is a cross-sectional view of an area array type semiconductor package according to an exemplary embodiment of the invention.

Exemplary embodiments of the invention will be described below with reference to accompanying drawings. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art. In the drawings, the thickness and spacing of layers and regions may be enlarged or reduced for clarity and are not intended to be to scale. When a layer is referred to as being "on" another layer or substrate, the layer may be directly on the other layer or substrate, or intervening layers may also be present.

FIG. 1 is a cross-sectional view of an exemplary embodiment of the invention showing an area array type semiconductor package 100. Referring to FIG. 1, a plurality of solder balls 60 may be formed on the lower surface of semiconductor package 100, with a plurality of solder posts 50 provided through an encapsulation body 40 to establish an one-to-one electrical connection between the solder balls 60 and an area exposed on an upper surface of semiconductor package 100. The solder posts 50, as well as the solder balls 60, may then be used for establishing connections between adjacent packages in a semiconductor stack package.

Figure 3:
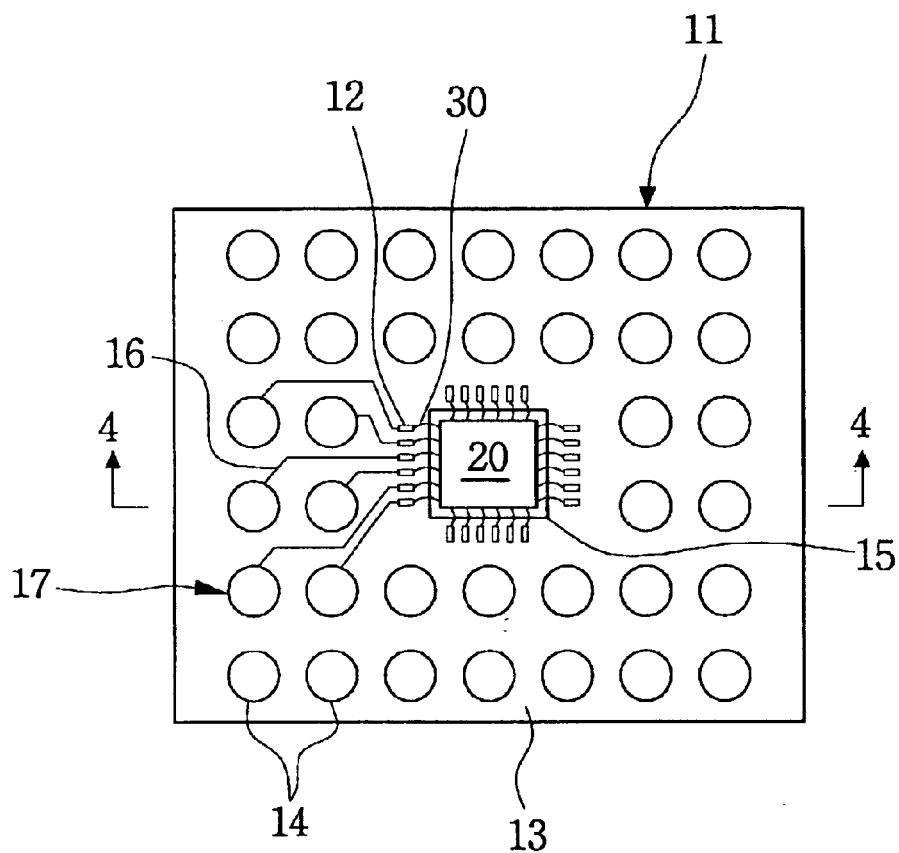
FIG. 3 is an enlarged plan view of the unit circuit board in FIG. 2.

As illustrated in FIG. 3, a circuit pattern 17 may be provided on the upper side of a flexible base tape 13 such as a polyimide tape. The circuit pattern 17 may be provided around a centrally located chip mounting pad 15 on the upper surface of the flexible base tape 13. Additionally, the circuit pattern 17 may include interconnection pads 12 provided near the chip mounting pad 15, and ball mounting pads 14 that may be connected to the interconnection pads 12 by internal wires 16. Via holes 18 (not shown) may be formed in the flexible base tape 13 to enable the solder balls 60 to be connected to the ball mounting pads 14.

Figure 4:
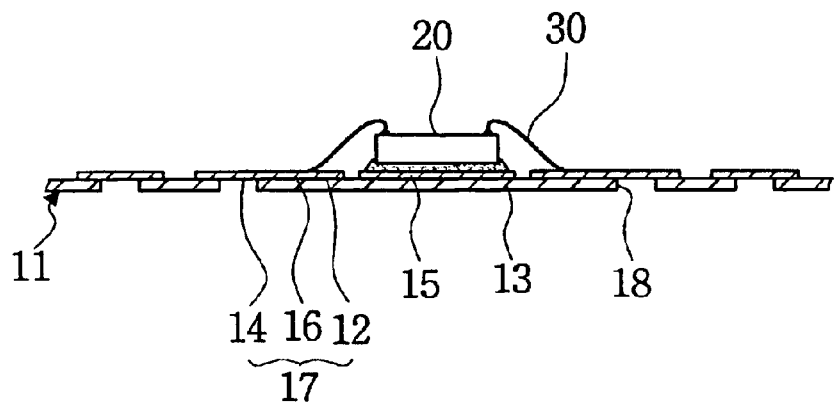
FIG. 4 is a cross-sectional view of an exemplary embodiment of the invention taken along the lines 4—4 of FIG. 3.
Figure 5:
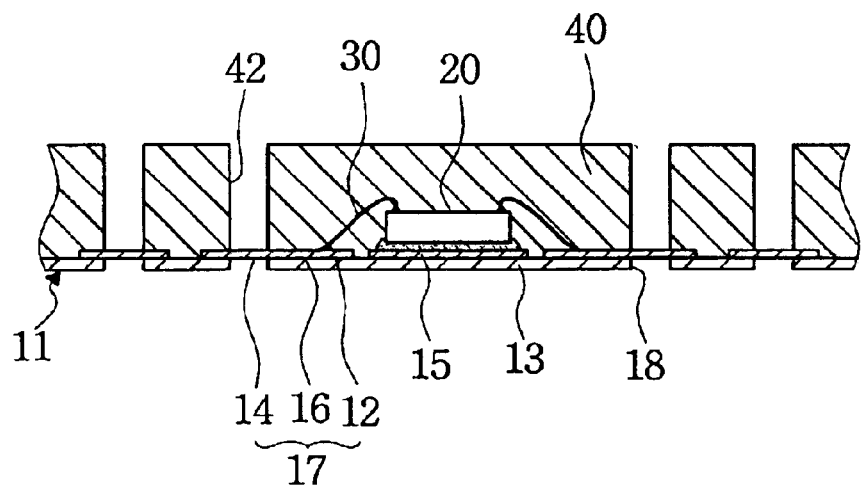
FIG. 5 is a cross-sectional view of an exemplary embodiment of the invention showing an encapsulation body having connecting holes and provided on the circuit board.

As illustrated in FIG. 4, a semiconductor chip 20 may be attached to the chip mounting pad 15 of the unit tape circuit board 11. The interconnection pads 12 and the semiconductor chip 20 may then be electrically connected to each other using bonding wires 30. As illustrated in FIG. 5, in order to protect the semiconductor chip 20, the bonding wires 30 and the circuit pattern 17, an encapsulation body 40 may be formed on the upper surface of the tape circuit board 11. The encapsulation body 40 may be formed from a variety of materials such as resin.

Figure 6:
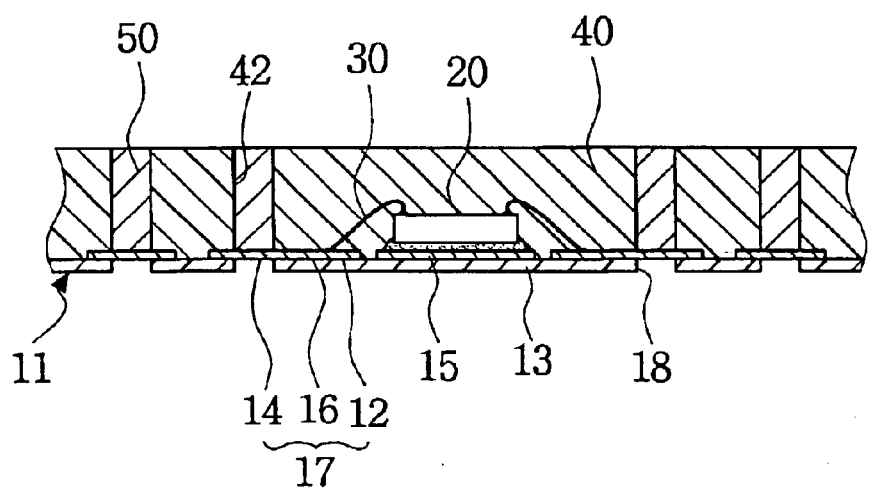
FIG. 6 is a cross-sectional view of an exemplary embodiment of the invention showing solder posts filling the connecting holes.
Figure 7:
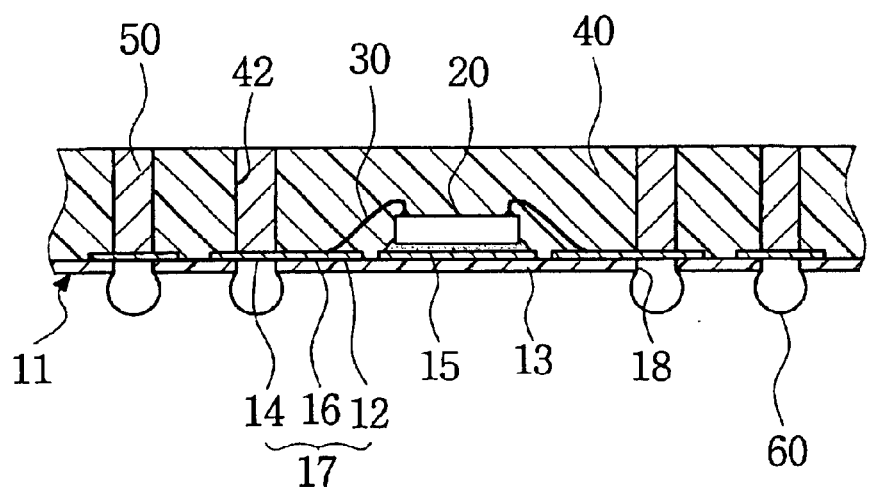
FIG. 7 is a cross-sectional view of an exemplary embodiment of the invention showing solder balls provided under the circuit board.
Figure 8:
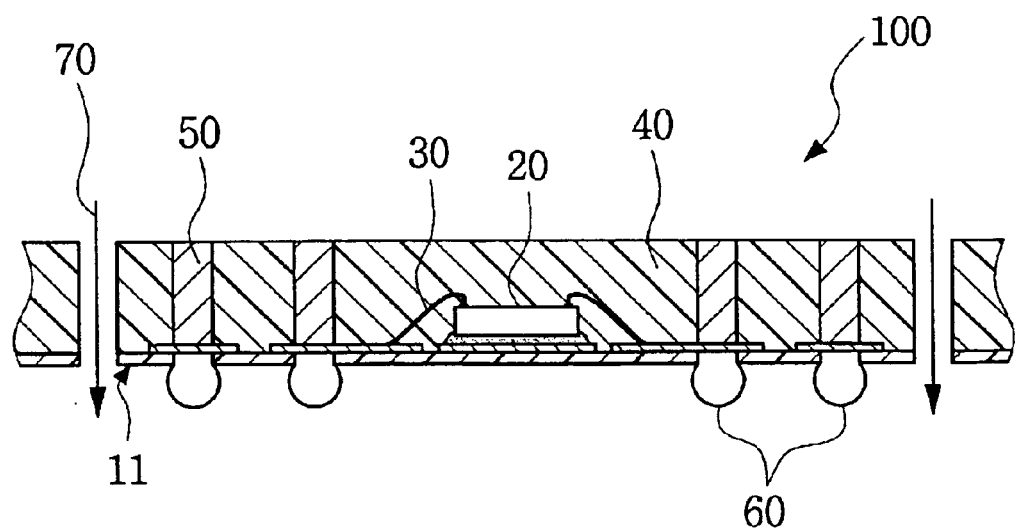
FIG. 8 is a cross-sectional view of an exemplary embodiment of the invention showing a separation of individual semiconductor packages shown in FIG. 1.

As illustrated in FIG. 6, in order to establish electrical connection between the stacked semiconductor packages, a plurality of connecting holes 42 may be provided through the encapsulation body 40 above the ball mounting pads 14. Solder posts 50 may then be formed by filling the connecting holes 42 with solder. As illustrated in FIG. 7, solder balls 60 may then be formed on the portions of the ball mounting pads 14 that are exposed through the via holes 18 of the unit circuit board 11. The solder balls 60 and the solder posts 50 provided on opposite sides of the ball mounting pads 14 may be arranged in vertical alignment to simplify the stacking and connection of multiple semiconductor packages 100. The diameter of the connecting holes 42 may also be sized to approximate the diameter of the corresponding via holes 18.

Figure 2:
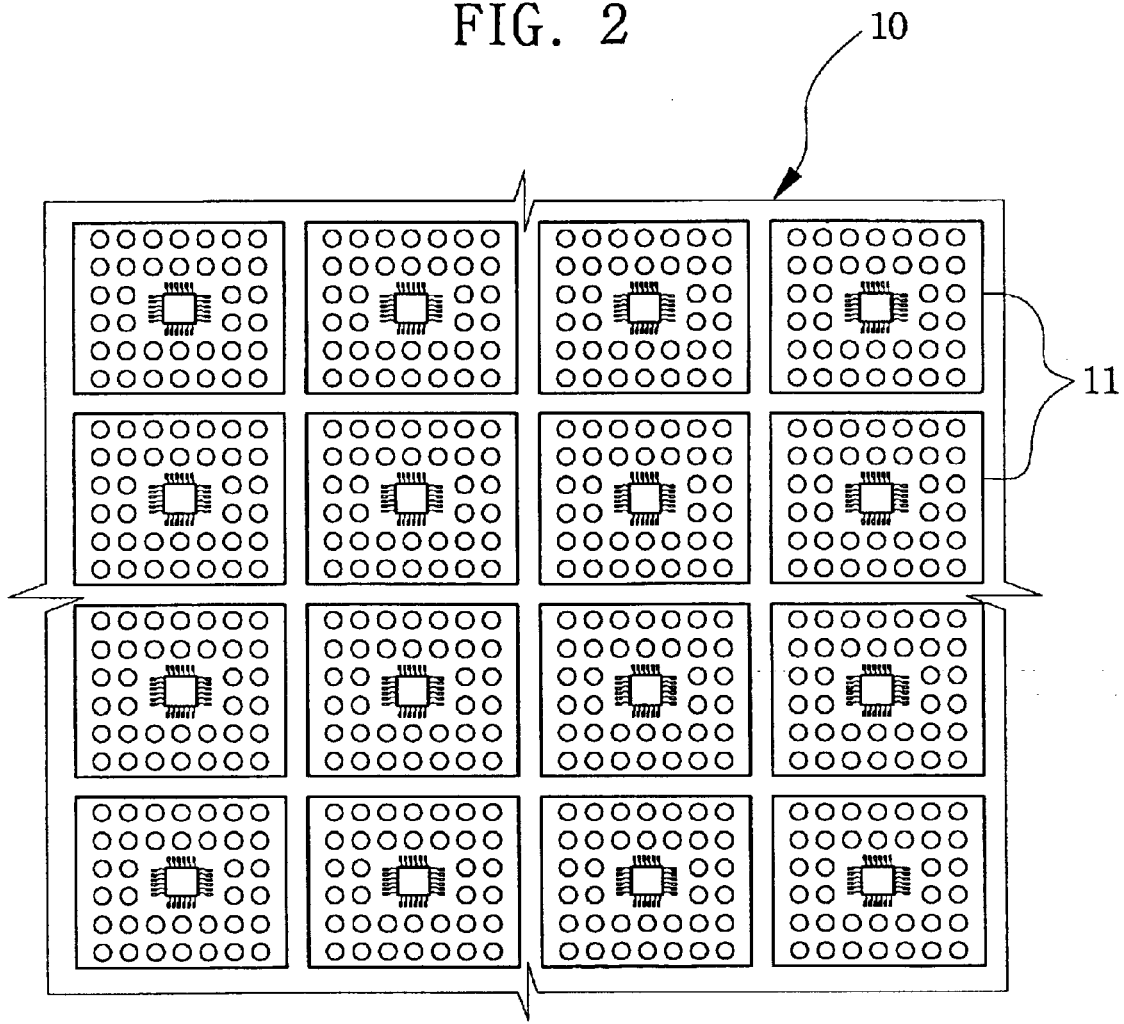
FIG. 2 is a plan view of an exemplary embodiment of the invention showing a plurality of tape circuit boards prior to cutting, with semiconductor chips which are attached and electrically connected to the tape circuit boards.

A process for making the semiconductor package 100 shown in FIG. 1 will be further described with reference to FIGS. 2–8. A tape circuit board 10 may be prepared as shown in FIG. 2. The tape circuit board 10 will typically include a plurality of the unit tape circuit boards 11 described above for producing a plurality of semiconductor packages simultaneously. The tape circuit board 10 itself may be produced and supplied to the manufacturing operation using conventional techniques.

A semiconductor chip 20 may then be attached to the chip mounting pad 15 of each of the unit tape circuit board 11 as illustrated in FIGS. 2–4. Once mounted on the unit tape circuit board 11, the semiconductor chip 20 may be electrically connected to interconnection pads 12 using bonding wires 30.

An encapsulation body 40 may then be formed over the semiconductor chip 20 and bonding wires 30 as shown in FIG. 5. For example, the encapsulation body 40 may be formed using a molding method in which a liquid resin is supplied on the upper surface of the unit tape circuit board 11 and then cured. The encapsulation body 40 may encapsulate each unit tape circuit board 11 individually or may encapsulate a plurality of adjacent unit tape circuit boards arranged on the tape circuit board 10. If more than one unit tape circuit board 11 is included in a single encapsulation body 40, the unit circuit boards 11 may be separated during the package separation step described below.

The encapsulation body 40 includes or is provided with connecting holes 42 through which the ball mounting pads 14 are exposed. If the encapsulation body 40 is formed with a resin molding process, the connecting holes 42 may be formed during the molding process. This may be accomplished by providing an upper mold die having protrusions or other obstacles arranged to prevent the liquid resin from filling the area above the ball mounting pads 14. When resin is cured and the upper mold die is removed, the connecting holes 42 will remain in the encapsulation body 40.

Solder posts 50 may then be formed by filling the connecting holes 42 with solder as illustrated in FIG. 6. The solder posts 50 may be formed, for example, from an initial solder ball or from solder paste. In the solder ball method, a solid solder ball (such as the solder balls 60 used as terminals) may be provided above each connecting hole 42 and then reflowed, allowing the solder from the solder ball to flow into and fill the connecting hole 42. In solder paste method, a quantity of solder paste may be applied to encapsulating body to fill the connecting holes 42 using a method such as screen-printing. This solder paste may then be reflowed to form the solder posts 50.

Solder balls 60 may then be formed as illustrated in FIG. 7. The solder balls 60 may be formed on the lower side of the ball mounting pads 14 that have been exposed through the via holes 18. A flux is typically applied to the ball mounting pads 14 before the solder balls 60 are formed. The solder balls 60 may then be mounted on the pads 14 and reflowed. Similarly, solder ball may also be provided on the upper surfaces of the solder posts 50 to produce a semiconductor package having solder balls arranged on both the upper and lower surfaces. Nickel (Ni), gold (Au) and their alloys may also be used to form the solder balls 60.

Individual semiconductor packages 100 may then be separated from the tape circuit board 10 using a conventional cutting tool such as a blade wheel or laser to form a separation 70 between adjacent semiconductor packages. If the encapsulation body 40 covers more than one of the unit tape circuit boards 11, the encapsulation body 40 will also typically be divided into portions covering a single unit circuit board 11 during the package separation process. Although this exemplary embodiment was described with reference to a tape circuit board, those of ordinary skill in the art will appreciate that a printed circuit board may be utilized as an alternative with post mounting pads provided on the upper side of the printed circuit board and aligned with the ball mounting pads.

Figure 9:
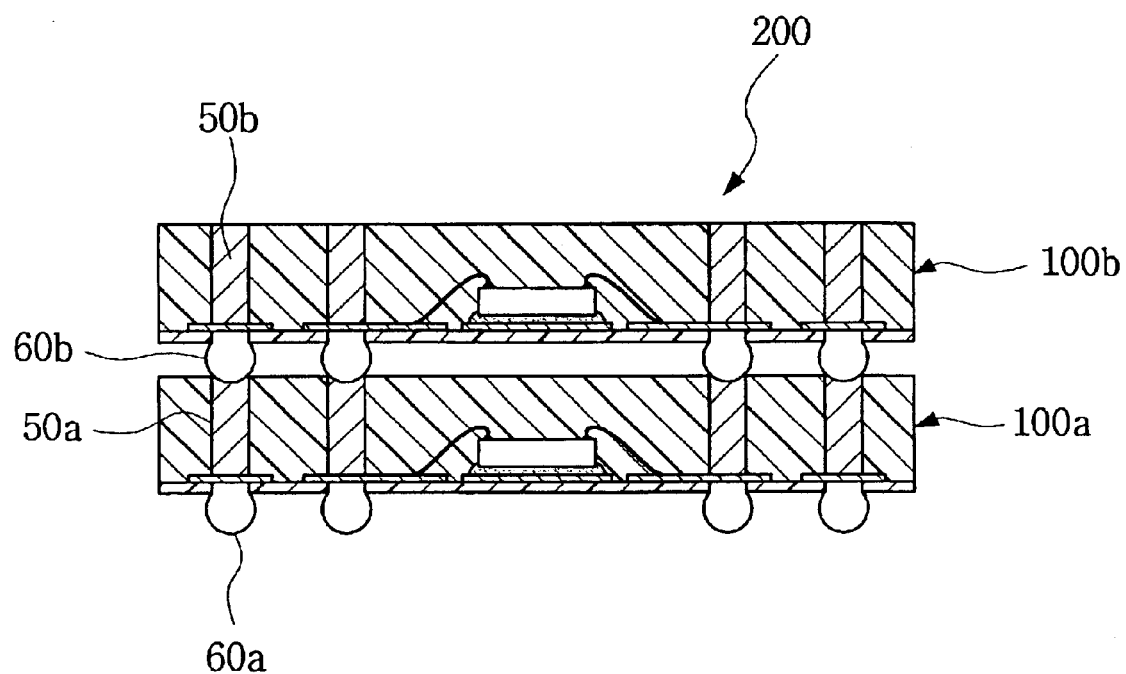
FIG. 9 is a cross-sectional view of an exemplary embodiment of the invention showing a package stack produced by stacking the semiconductor packages of FIG. 1.

Packages 100a and 100b fabricated using the process described above may then be stacked to produce a package stack 200 as shown in FIG. 9. As illustrated in FIG. 9, the upper semiconductor package 100b may be electrically connected to the lower semiconductor package 100a by a direct joint formed between the solder post 50a of the lower package 100a and the corresponding solder ball 60b of the upper package 100b. In the process of making such a connection, the solder balls 60b of the upper package 100b are arranged above and aligned with the corresponding the solder posts 50a of the lower package 100a and then reflowed to form a solder joint. The connection using the solder posts and solder balls can allow pin-to-pin interconnection between the packages 100a and 100b. That is, since the solder balls 60a and 60b and the solder posts 50a and 50b are vertically aligned, a direct electrical connection may be made between the corresponding terminals of each of the packages included in the stack to produce a 3-dimensional stack of area array type packages.

In the exemplary embodiment 3-dimensional package stack of the invention, the solder balls 60a of the lower package 100a may be used as external terminals of the package stack 200 for final assembly of the package stack onto another electronic device such as a mother board. In addition, the solder posts 50b of the upper package 100b may also be accessed for testing purposes after the package stack 200 is assembled on the electronic device. Although an exemplary embodiment of the invention has been described with reference to two stacked semiconductor packages, those of ordinary skill in the art will appreciate that the process described may also be utilized to form stack packages of three of more semiconductor packages.

While the present invention has been particularly shown and described with reference to certain exemplary embodiments, it should be understood that the scope of the present invention is defined by the claims provided below and is not restricted to the exemplary embodiments. In addition, it is obvious that, guided by the present disclosure, one of ordinary skill in the art may be able to make various deviations from and modifications to the exemplary embodiments without departing from the scope of the invention.

What is claimed is:

1. A semiconductor package comprising:
a circuit board having an upper surface and a lower surface;
a plurality of conductive connectors provided on the lower surface;
a plurality of contact regions provided on the upper surface, wherein each contact region is in electrical contact with at least one of the conductive connectors;
an encapsulation body provided on the upper surface of the circuit board; and
a plurality of conductive posts each extending substantially through the encapsulation body, wherein each conductive post provides a portion of a conductive path between a conductive connector and a contact region.

2. The semiconductor package of claim 1, wherein:
the circuit board is a tape circuit board provided on a flexible base tape.

3. The semiconductor package of claim 2, wherein:
the plurality of conductive connectors are solder balls; and
the plurality of conductive posts are solder posts.

4. The semiconductor package of claim 3, wherein:
the plurality of solder balls are arranged in vias formed on the lower surface of the circuit board to expose a plurality of ball mounting pads; and
the plurality of solder posts are arranged in connecting holes formed in the encapsulating body.

5. The semiconductor package of claim 4, wherein:
each of the plurality solder balls is in electrical contact with a lower portion of one of the plurality of ball mounting pads; and
each of the plurality of solder posts is in electrical contact with an upper portion of one of the plurality of ball mounting pads.

6. The semiconductor package of claim 5, wherein:
each solder ball is in electrical contact with only one ball mounting pad and one solder post.

7. The semiconductor package of claim 6, wherein:
each solder ball is aligned with a corresponding solder post in a direction substantially perpendicular to the upper surface of the circuit board.

8. The semiconductor package of claim 5, wherein:
a first group of solder balls are in electrical contact at least one other solder bail and a second group of solder balls are electrically isolated from all other solder balls.

9. A semiconductor package comprising:
a circuit board having an upper surface and a lower surface;
a circuit pattern provided on the upper surface of the circuit board, the circuit pattern including ball mounting pads;
a semiconductor chip mounted on the upper surface of the circuit board and electrically connected to the circuit pattern;
an encapsulation body provided on the upper surface of the circuit board and encapsulating the semiconductor chip, the encapsulation body including a plurality of connecting holes, each connecting hole exposing a portion of an upper surface of a corresponding ball mounting pad;
a plurality of solder posts, extending through the connecting holes to contact the corresponding ball mounting pads;
a plurality of vias formed through the lower surface of the circuit board, each via exposing a portion of a lower surface of one the ball mounting pads; and
a plurality of conductive connectors, each conductive connector formed on the exposed portion of the lower surface of one of the ball mounting pads wherein each of the solder posts provides a substantial portion of a conductive path between at least one conductive connector and the circuit pattern.

10. The semiconductor package of claim 9, wherein:
the circuit board is a tape circuit board provided on a flexible base tape.

11. The semiconductor package of claim 10, wherein:
the conductive connectors are solder balls.

12. The semiconductor package of claim 11, wherein:
each solder ball is associated with a single corresponding solder post, the solder balls and the corresponding solder posts being aligned in a direction generally perpendicular to the upper surface of the circuit board.

13. The semiconductor package of claim 12, wherein:
each connecting hole has a first diameter and is associated with a single corresponding via hole having a second diameter.

14. The semiconductor package of claim 13, wherein:
the first diameter is approximately equal to the second diameter.

15. The semiconductor package of claim 13, wherein:
a second plurality of solder balls is formed on an upper surface of the solder posts.

16. A semiconductor package stack including a plurality of semiconductor packages according to claim 12 comprising:
a first semiconductor package; and
a second semiconductor package, wherein
the first semiconductor package is arranged on the second semiconductor package so that solder balls on the first semiconductor package are aligned with and electrically connected to corresponding solder posts on the second semiconductor package.

17. A semiconductor package stack according to claim 16, wherein:
the first and second semiconductor packages are aligned to produce a one-to-one correspondence between the solder balls of the first semiconductor package and the solder posts of the second semiconductor package.

18. A semiconductor package stack according to claim 17, wherein:
the solder balls of the first semiconductor package have been combined with the solder posts of the second semiconductor package to form a plurality of solder joints connecting the first and second semiconductor packages.

19. A semiconductor package stack including a plurality of semiconductor packages comprising:
a first semiconductor package according to claim 15;
a second semiconductor package having a plurality of solder posts exposed on an upper surface;
the first semiconductor package being arranged on the second semiconductor package so that the solder balls formed on the ball mounting pads of the first semiconductor package are aligned with and electrically connected to corresponding solder posts on the second semiconductor package.

20. A method of manufacturing a semiconductor package comprising:
forming a circuit board having an upper and a lower surface having a circuit pattern on the upper surface of the circuit board, the circuit pattern including ball mounting pads, interconnection pads, and a chip mounting pad;
mounting a semiconductor chip on the chip mounting pad;
establishing an electrical connection between the semiconductor chip and the interconnection pads;
forming an encapsulation body on upper surface of the circuit board, the encapsulation body including a plurality of connecting holes, each connecting hole extending through the encapsulation body from an upper surface of the encapsulation body to expose a portion of an upper surface of a corresponding ball mounting pad;
forming a plurality of solder posts in the plurality of connecting holes, each solder post having an upper surface and extending through a connecting hole to contact the corresponding ball mounting pad;
forming a plurality of vias on the lower surface of the circuit board to expose a portion of a lower surface of the plurality of ball mounting pads; and
forming a plurality of solder balls on the exposed lower surfaces of the plurality of ball mounting pads.

21. A method of manufacturing a semiconductor package according to claim 20, wherein:
the circuit board is a tape circuit board provided on a flexible base tape.

22. A method of manufacturing a semiconductor package according to claim 21, wherein forming the plurality of solder posts further comprises:
forming a plurality of solder deposits at the upper surface of the encapsulation body adjacent the plurality of connecting holes;
heating the solder deposits to cause the solder to flow into the connecting holes; and
cooling the solder in the connecting holes to form solder posts.

23. A method of manufacturing a semiconductor package according to claim 22, wherein:
the connecting holes are substantially completely filled with solder.

24. A method of manufacturing a semiconductor package according to claim 21, wherein forming the plurality of solder posts further comprises:
filling the connecting holes with a solder paste;
heating the solder paste to form solder in the connecting holes; and
cooling the solder in the connecting holes to form solder posts.

25. A method of manufacturing a semiconductor package according to claim 24, wherein filling the connecting holes with solder paste further comprises:
applying solder paste to the upper surface of the encapsulation body by screen printing.

26. A method of manufacturing a semiconductor package according to claim 25, wherein applying solder paste to the upper surface of the encapsulation body by screen printing further comprises:
selectively applying the solder paste to regions of the upper surface of the encapsulating body adjacent the connecting holes.

27. A method of manufacturing a semiconductor package according to claim 24, wherein:
the connecting holes are substantially completely filled with solder.

28. A method of manufacturing a semiconductor package stack comprising:
preparing first and second semiconductor packages according to the method of claim 21;
orienting the first and second semiconductor packages so that solder balls of the first package are aligned with corresponding solder posts of the second package; and
reflowing the solder bails of the first semiconductor package to form solder joints with the corresponding solder posts of the second semiconductor package.

29. A method of manufacturing a semiconductor package stack according to claim 28, wherein:
the step of aligning the first and second semiconductor packages produces a one-to-one correspondence between the solder balls of the first semiconductor package and the solder posts of the second semiconductor package.

30. A method of manufacturing a semiconductor package stack according to claim 29, wherein:
the step of aligning the first and second semiconductor packages places a lower surface of each solder ball in contact with an upper surface of the corresponding solder post.

31. A semiconductor package according to claim 10, manufactured by:

forming a circuit board having an upper and a lower surface having a circuit pattern on the upper surface of the circuit board, the circuit pattern including ball mounting pads, interconnection pads, and a chip mounting pad;

mounting a semiconductor chip on the chip mounting pad;

establishing an electrical connection between the semiconductor chip and the interconnection pads;

forming an encapsulation body on upper surface of the circuit board, the encapsulation body including a plurality of connecting holes, each connecting hole extending through the encapsulation body from an upper surface of the encapsulation body to expose a portion of an upper surface of a corresponding ball mounting pad;

forming a plurality of solder posts in the plurality of connecting holes, each solder post having an upper surface and extending through a connecting hole to contact the corresponding ball mounting pad;

forming a plurality of vias on the lower surface of the circuit board to expose a portion of a lower surface of the plurality of ball mounting pads; and forming a plurality of solder balls on the exposed lower surfaces of the plurality of ball mounting pads.

* * * * *